US010734452B1

(12) United States Patent
Kim et al.

(10) Patent No.: US 10,734,452 B1
(45) Date of Patent: Aug. 4, 2020

(54) ORGANIC LIGHT-EMITTING DISPLAY APPARATUS

(71) Applicant: Samsung Display Co., Ltd., Yongin-si, Gyeonggi-do (KR)

(72) Inventors: Geebum Kim, Yongin-si (KR); Jungha Son, Yongin-si (KR); Byunghan Yoo, Yongin-si (KR); Chaungi Choi, Yongin-si (KR); Sangwoo Kim, Yongin-si (KR); Taekyung Ahn, Yongin-si (KR); Kijune Lee, Yongin-si (KR); Jaeik Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/581,002

(22) Filed: Sep. 24, 2019

(30) Foreign Application Priority Data

Jan. 16, 2019 (KR) .......................... 10-2019-0005852

(51) Int. Cl.
*H01L 27/32* (2006.01)
*H01L 51/52* (2006.01)

(52) U.S. Cl.
CPC ........ *H01L 27/3218* (2013.01); *H01L 27/323* (2013.01); *H01L 27/3246* (2013.01); *H01L 51/5271* (2013.01); *H01L 51/5275* (2013.01)

(58) Field of Classification Search
CPC ............. H01L 27/3216; H01L 27/3218; H01L 27/322; H01L 27/323; H01L 27/3246; H01L 27/3258; H01L 27/3262; H01L 27/3276; H01L 51/5225; H01L 51/5262; H01L 51/5271; H01L 51/5275
See application file for complete search history.

(56) References Cited

U.S. PATENT DOCUMENTS

| | | | |
|---|---|---|---|
| 9,142,802 B2 | 9/2015 | Miyamoto et al. | |
| 2014/0353630 A1* | 12/2014 | Baek | H01L 51/5262 257/40 |
| 2018/0181240 A1* | 6/2018 | Heo | H01L 27/323 |
| 2018/0190942 A1 | 7/2018 | Song | |

FOREIGN PATENT DOCUMENTS

| | | |
|---|---|---|
| JP | 2007-149527 A | 6/2007 |
| JP | 2009-110873 A | 5/2009 |
| JP | 2013-73884 A | 4/2013 |
| KR | 10-2018-0078142 A | 7/2018 |

* cited by examiner

*Primary Examiner* — Cuong Q Nguyen
(74) *Attorney, Agent, or Firm* — Lewis Roca Rothgerger Christie LLP

(57) ABSTRACT

An organic light-emitting display apparatus implemented by using a plurality of organic light-emitting diodes on a substrate and including a first pixel and a second pixel respectively emitting light of different colors, includes: a pixel-defining layer including a first opening and a second opening, the first opening defining an emission area of the first pixel, and the second opening defining an emission area of the second pixel; a total reflective layer over the pixel-defining layer, the total reflective layer including a first upper opening corresponding to the first pixel and a second upper opening corresponding to the second pixel; and a planarization layer covering the total reflective layer and having a refractive index greater than a refractive index of the total reflective layer, wherein an area of the first upper opening is different from an area of the second upper opening.

20 Claims, 10 Drawing Sheets

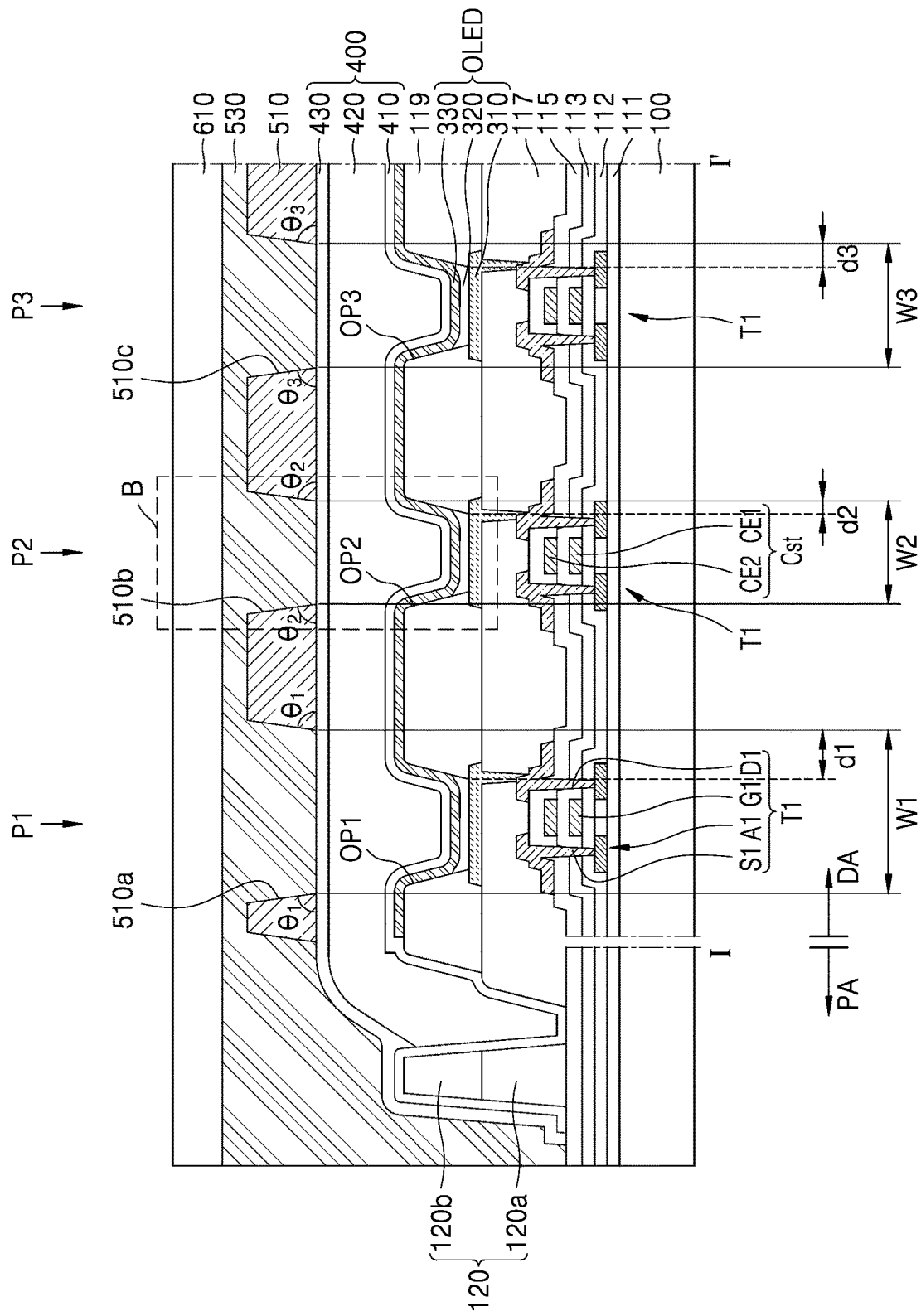

ORGANIC LIGHT-EMITTING DISPLAY APPARATUS

CROSS-REFERENCE TO RELATED APPLICATION

This application claims priority to and the benefit of Korean Patent Application No. 10-2019-0005852, filed on Jan. 16, 2019, in the Korean Intellectual Property Office, the disclosure of which is incorporated herein in its entirety by reference.

BACKGROUND

1. Field

Aspects of some example embodiments relate to an organic light-emitting display apparatus.

2. Description of the Related Art

An organic light-emitting display apparatus includes an organic light-emitting diode including a hole injection electrode and an electron injection electrode, with an organic emission layer therebetween. An organic light-emitting display apparatus is a self-luminous display apparatus that emits light while excitons fall from an excited state to a ground state, the excitons being generated when holes injected from the hole injection electrode and electrons injected from the electron injection electrode combine in the organic emission layer.

Because an organic light-emitting display apparatus, which is a self-luminous display apparatus, does not require a separate light source, it may be driven at a low voltage and configured to have a lightweight slim profile, and has high-quality characteristics such as wide viewing angles, high contrast, and fast response speeds.

Generally, an organic light-emitting display apparatus includes a plurality of pixels respectively emitting light of different colors, and the plurality of pixels emit light and thus display an image.

Here, a pixel means a minimum unit configured to display an image. A gate line and a data line each configured to drive each pixel, a power line such as a driving power line, an insulating layer of a pixel-defining layer defining an emission area or a shape of each pixel, etc. may be located between neighboring pixels.

The above information disclosed in this Background section is only for enhancement of understanding of the background and therefore it may contain information that does not constitute prior art.

SUMMARY

Aspects of some example embodiments relate to an organic light-emitting display apparatus, and for example, to an organic light-emitting display apparatus having a total internal reflection structure to improve light efficiency.

One or more embodiments include an organic light-emitting display apparatus, and for example, an organic light-emitting display apparatus which improves light efficiency and simultaneously has an excellent white angle difference (WAD). However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments.

According to one or more embodiments, an organic light-emitting display apparatus implemented by using a plurality of organic light-emitting diodes arranged over a substrate and including a first pixel and a second pixel respectively emitting light of different colors, includes: a pixel-defining layer including a first opening and a second opening, the first opening defining an emission area of the first pixel, and the second opening defining an emission area of the second pixel; a total reflective layer over the pixel-defining layer, the total reflective layer including a first upper opening corresponding to the first pixel and a second upper opening corresponding to the second pixel; and a planarization layer covering the total reflective layer and having a refractive index greater than a refractive index of the total reflective layer, wherein an area of the first upper opening is different from an area of the second upper opening.

According to some example embodiments, a horizontal spaced distance along a top surface of the substrate between an edge of the first opening of the pixel-defining layer and an inner edge of the first upper opening may be different from a horizontal spaced distance between an edge of the second pixel and an inner edge of the second upper opening.

According to some example embodiments, the first upper opening and the second upper opening may be provided in a quadrangular shape in which corners thereof are rounded.

According to some example embodiments, a cross-sectional shape of the first upper opening may have a tapered main inclination, and an angle θ of the main inclination may satisfy the Condition below:

$$\theta > \sin^{-1}\left(\frac{n1}{n2}\right)$$

(where n1 is a refractive index of the total reflective layer, and n2 is a refractive index of the planarization layer).

According to some example embodiments, the organic light-emitting display apparatus may further include: a thin-film encapsulation layer that is over the substrate and covers the plurality of organic light-emitting diodes, the thin-film encapsulation layer including a first inorganic encapsulation layer, an organic encapsulation layer, and a second inorganic encapsulation layer, wherein the total reflective layer may be arranged over the thin-film encapsulation layer.

According to some example embodiments, a horizontal spaced distance 'd' along a top surface of the substrate between an edge of the first opening and an inner edge of the first upper opening may satisfy Conditions 1 and 2 below:

$$0 < d \leq d\ \text{max} \quad \text{Condition 1}$$

$$d\text{max} = t2\tan\left(\sin^{-1}\left(\frac{n2}{n3}\sin(\pi - 2\theta)\right)\right) \quad \text{Condition 2}$$

(where t2 is a thickness of the organic encapsulation layer, n3 is a refractive index of the organic encapsulation layer, and n2 is a refractive index of the planarization layer).

According to some example embodiments, a cross-sectional shape of the first upper opening and the second upper opening may have a tapered main inclination and an inclined structure having an angle different from that of the main inclination, and an angle θ of the main inclination may satisfy the Condition below:

$$\theta > \sin^{-1}\left(\frac{n1}{n2}\right)$$

(where n1 is a refractive index of the total reflective layer, and n2 is a refractive index of the planarization layer)

According to some example embodiments, the organic light-emitting display apparatus may further include: a thin-film encapsulation layer that is over the substrate and covers the plurality of organic light-emitting diodes, the thin-film encapsulation layer including a first inorganic encapsulation layer, an organic encapsulation layer, and a second inorganic encapsulation layer; and a touchscreen arranged on the thin-film encapsulation layer, wherein the total reflective layer may be arranged on the touchscreen.

According to some example embodiments, the organic light-emitting display apparatus may further include: a third pixel configured to emit light of a color different from that of the first pixel and that of the second pixel, wherein the total reflective layer may include a third upper opening corresponding to the third pixel, and an area of the third upper opening may be different from the respective areas of the first upper opening and the second upper opening.

According to some example embodiments, a horizontal spaced distance between an edge of the third pixel and an inner edge of the third upper opening may be different from a horizontal spaced distance between an edge of the first pixel and an inner edge of the first upper opening.

According to one or more embodiments, an organic light-emitting display apparatus including a first organic light-emitting diode, a second organic light-emitting diode, and a third organic light-emitting diode arranged in a display area over a substrate, the first organic light-emitting diode, the second organic light-emitting diode, and the third organic light-emitting diode respectively emitting light of different colors, includes: a pixel-defining layer covering edges of a pixel electrode of each of the first organic light-emitting diode, the second organic light-emitting diode, and the third organic light-emitting diode, and having a first opening, a second opening, and a third opening respectively defining respective emission areas of the first organic light-emitting diode, the second organic light-emitting diode, and the third organic light-emitting diode by respectively exposing respective central portions of the first organic light-emitting diode, the second organic light-emitting diode, and the third organic light-emitting diode; a thin-film encapsulation layer including at least one organic encapsulation layer and at least one inorganic encapsulation layer, and covering the first organic light-emitting diode, the second organic light-emitting diode, and the third organic light-emitting diode; a total reflective layer arranged over the thin-film encapsulation layer and including a first upper opening, a second upper opening, and a third upper opening respectively corresponding to the first opening, the second opening, and the third opening; and a planarization layer covering the total reflective layer, wherein a horizontal spaced distance 'd1' along a top surface of the substrate between an edge of the first opening and an inner edge of the first upper opening may be different from a horizontal spaced distance 'd2' between an edge of the second opening and an inner edge of the second upper opening.

According to some example embodiments, the horizontal spaced distance 'd1' along the top surface of the substrate between the edge of the first opening and the inner edge of the first upper opening may be different from a horizontal spaced distance 'd3' between an edge of the third opening and an inner edge of the third upper opening.

According to some example embodiments, a refractive index of the planarization layer may be greater than a refractive index of the total reflective layer.

According to some example embodiments, at least one of an area of the first upper opening, an area of the second upper opening, and an area of the third upper opening may be different from the others.

According to some example embodiments, a cross-sectional shape of each of the first upper opening, the second upper opening, and the third upper opening may have a tapered main inclination, and angles of the main inclinations may be substantially the same.

According to some example embodiments, an angle θ of the main inclinations may satisfy the Condition below:

$$\theta > \sin^{-1}\left(\frac{n1}{n2}\right)$$

(where n1 is a refractive index of the total reflective layer, and n2 is a refractive index of the planarization layer)

According to some example embodiments, the horizontal spaced distances 'd1' and 'd2' may satisfy Conditions 1 and 2 below:

$$0 < d1, d2 \leq d\max \qquad \text{Condition 1}$$

$$d\max = t2\tan\left(\sin^{-1}\left(\frac{n2}{n3}\sin(\pi - 2\theta)\right)\right) \qquad \text{Condition 2}$$

(where t2 is a thickness of the organic encapsulation layer, n3 is a refractive index of the organic encapsulation layer, and n2 is a refractive index of the planarization layer)

According to some example embodiments, at least one of respective sizes of the first opening, the second opening, and the third opening may be different from the others.

According to some example embodiments, the organic light-emitting display apparatus may further include: a touchscreen arranged on the thin-film encapsulation layer over the substrate, wherein the total reflective layer may be arranged on the touchscreen.

According to some example embodiments, the organic light-emitting display apparatus may further include: a dam unit arranged in a peripheral area around the display area over the substrate and protruding from the substrate.

BRIEF DESCRIPTION OF THE DRAWINGS

These and/or other aspects will become apparent and more readily appreciated from the following description of the embodiments, taken in conjunction with the accompanying drawings in which:

FIG. 3 is a cross-sectional view taken along the line I-I' of FIG. 2A and a cross-sectional view of a portion of a peripheral area of an organic light-emitting display apparatus according to some example embodiments;

DETAILED DESCRIPTION

Figure 1:
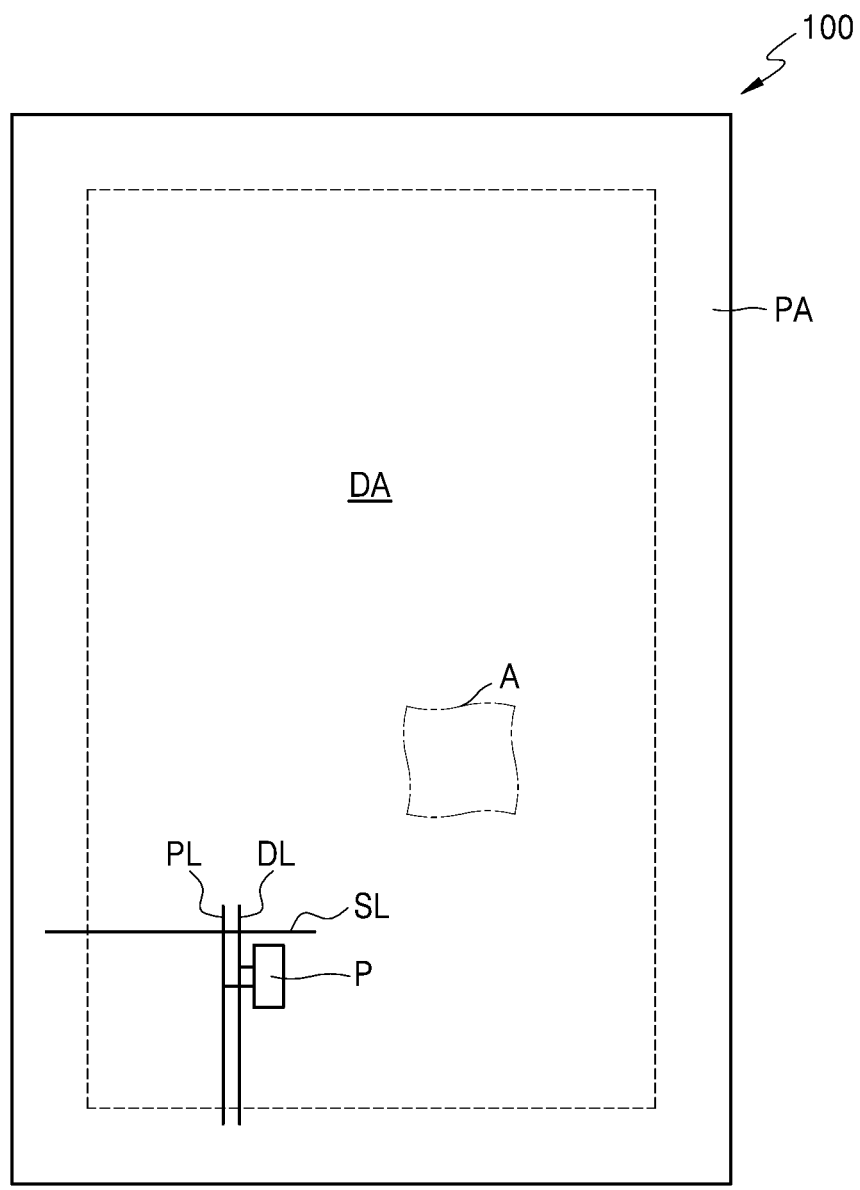
FIG. 1 is a plan view of an organic light-emitting display apparatus according to some example embodiments.

As the disclosure allows for various changes and numerous embodiments, aspects of some example embodiments will be illustrated in the drawings and described in more detail in the written description. An effect and a characteristic of the disclosure, and a method of accomplishing these will be more apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

As used herein, the term "and/or" includes any and all combinations of one or more of the associated listed items. Expressions such as "at least one of" when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises/includes" and/or "comprising/including" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "connected to or electrically connected" to another layer, region, or component, it may be "directly electrically connected" to the other layer, region, or component or may be "indirectly connected or electrically connected" to other layer, region, or component with other layer, region, or component interposed therebetween.

FIG. 1 is a plan view of an organic light-emitting display apparatus according to some example embodiments.

Referring to FIG. 1, a substrate 100 of the organic light-emitting display apparatus may be divided into a display area DA and a peripheral area PA around the display area DA. The organic light-emitting display apparatus may provide or display an image (e.g., a predetermined image) by using light emitted from a plurality of pixels P arranged in the display area DA.

Each pixel P may include an organic light-emitting diode and emit, for example, red, green, blue, or white light. That is, each pixel P may be connected to a pixel circuit including a thin film transistor TFT and a capacitor. The pixel circuit may be connected to a scan line SL, a data line DL intersecting with the scan line SL, and a driving voltage line PL.

When the pixel circuit is driven, each pixel P may emit light, and the display area DA provides a predetermined image by using light emitted from the pixels P. In the present specification, the pixel P may be defined as an emission area configured to emit red, green, blue, or white light as described above.

The peripheral area PA is an area in which the pixels P are not arranged and thus do not provide an image. A built-in driving circuit unit configured to drive the pixels P, a power supply line, and a terminal unit to which a printed circuit board including a driving circuit unit, or a driver integrated circuit (IC) is connected may be arranged in the peripheral area PA.

Figure 2A:
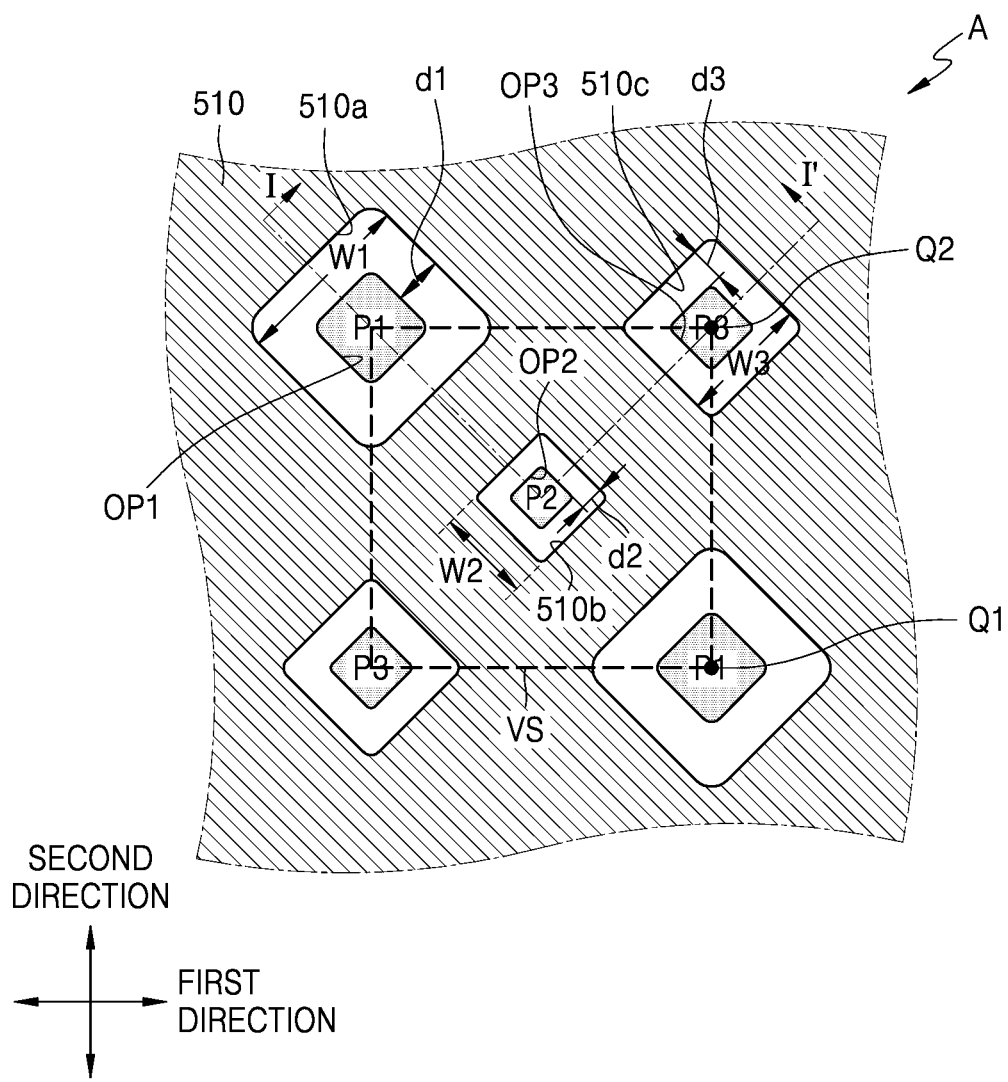
FIG. 2A is an enlarged plan view, according to some example embodiments, of region A of FIG. 1.

FIG. 2A is an enlarged plan view of a partial configuration of an embodiment that may be included in an area A of FIG. 1 and shows an arrangement relation of a plurality of pixels and upper openings respectively corresponding to the pixels.

Referring to FIG. 2A, the organic light-emitting display apparatus may include the plurality of pixels, and the plurality of pixels may include a first pixel P1, a second pixel P2, and a third pixel P3. For example, the first pixel P1 may emit blue light, the second pixel P2 may emit green light, and the third pixel P3 may emit red light. However, it is not limited thereto. For example, the first pixel P1 may emit red light, the second pixel P2 may emit green light, and the third pixel P3 may emit blue light. Various modifications may be made.

Each of the first pixel P1, the second pixel P2, and the third pixel P3 may have a quadrangular shape among polygonal shapes. In the present specification, a polygonal shape or a quadrangular shape includes a shape in which a vertex thereof is rounded. That is, each of the first pixel P1, the second pixel P2, and the third pixel P3 may have a quadrangular shape in which a vertex thereof is rounded.

Sizes of the first pixel P1, the second pixel P2, and the third pixel P3 may be different from each other. For example, an area of the second pixel P2 may be less than areas of the first pixel P1 and the third pixels P3, and the area of the first pixel P1 may be greater than the area of the third pixel P3. However, embodiments are not limited thereto. The sizes of the first pixel P1, the second pixel P2, and the third pixel P3 may be substantially the same. Various modifications may be made.

Also, the organic light-emitting display apparatus according to the present embodiment may include upper openings 510a, 510b, and 510c corresponding to the plurality of pixels, that is, the first pixel P1, the second pixel P2, and the third pixel P3. The upper openings 510a, 510b, and 510c may include regions formed by removing portions of a total reflective layer 510. An inner wall of the upper openings 510a, 510b, and 510c may have an inclined structure. When viewed in a plan view, the upper openings 510a, 510b, and 510c may be arranged to surround emission areas respectively of the pixels, that is, the first pixel P1, the second pixel P2, and the third pixel P3. In an embodiment, the upper openings 510a, 510b, and 510c may be provided in a quadrangular shape in which corners thereof are rounded.

The upper openings 510a, 510b, and 510c may include the first upper opening 510a, the second upper opening 510b, and the third upper opening 510c. The first upper opening 510a may be arranged to surround the first pixel P1. The second upper opening 510b may be arranged to surround the second pixel P2. The third upper opening 510c may be arranged to surround the third pixel P3.

The inner wall of the upper openings 510a, 510b, and 510c may include a structure configured to reflect light emitted from each of the pixels, that is, the first pixel P1, the second pixel P2, and the third pixel P3, and may be designed to improve front light efficiency. A mechanism of the upper openings 510a, 510b, and 510c is described in more detail below.

In the present embodiment, horizontal spaced distances d1, d2, and d3, which are spaced apart from edges respectively of the pixels, that is, the first pixel P1, the second pixel P2, and the third pixel P3, may be different depending on colors of the first pixel P1, the second pixel P2, and the third pixel P3. Here, the horizontal spaced distances d1, d2, and d3 may denote distances spaced apart along a top surface of the substrate 100.

For example, the first distance d1, which is a horizontal spaced distance between the edge of the first pixel P1 and an inner edge of the first upper opening 510a may be different from the second distance d2, which is a horizontal spaced distance between the edge of the second pixel P2 and an inner edge of the second upper opening 510b. Also, the first distance d1 may be different from the third distance d3, which is a horizontal spaced distance between the edge of the third pixel P3 and an inner edge of the third upper opening 510c. Meanwhile, the second distance d2 may be different from the third distance d3. In the present specification, the distance between each of the edges of the first pixel P1, the second pixel P2, and the third pixel P3, and each of the inner edges of the upper openings 510a, 510b, and 510c may denote a distance measured based on an edge closest to the substrate 100 as shown in FIG. 3.

That is, at least one of the first distance d1, the second distance d2, and the third distance d3 may be different. In an embodiment, the first distance d1, the second distance d2, and the third distance d3 may be provided based on a relation of d1>d3>d2.

In the present embodiment, the first upper opening 510a, the second upper opening 510b, and the third upper opening 510c may respectively have different areas. For example, in the case where the upper openings, that is, the first upper opening 510a, the second upper opening 510b, and the third upper opening 510c are provided in a quadrangular shape, at least one of widths W1, W2, and W3 of inner one sides of the first upper opening 510a, the second upper opening 510b, and the third upper opening 510c may be different. In an embodiment, the width W1 of the first upper opening 510a, the width W2 of the second upper opening 510b, and the width W3 of the third upper opening 510c may be provided based on a relation of W1>W3>W2.

As shown in the drawings, the first pixel P1, the second pixel P2, and the third pixel P3 may be arranged in a pixel arrangement of a pentile structure.

That is, the first pixel P1, the second pixel P2, and the third pixel P3 may be arranged such that the first pixel P1 is located at a first vertex Q1 of a virtual quadrangle VS with a central point of the second pixel P2 centered at the virtual quadrangle VS, and the third pixel P3 is located at a second vertex Q2 of the virtual quadrangle VS. The virtual quadrangle VS may include a square.

The first pixel P1 is spaced apart from the second pixel P2 and a central point of the first pixel P1 may be located at the first vertex Q1 of the virtual quadrangle VS. The first pixel P1 includes a plurality of first pixels P1, and the plurality of first pixels P1 are spaced apart from each other with the second pixel P2 therebetween.

The third pixel P3 is spaced apart from the first pixel P1 and the second pixel P2 and a central point of the third pixel P3 may be located at the second vertex Q2 adjacent to the first vertex Q1 of the virtual quadrangle VS. The third pixel P3 includes a plurality of third pixels P3, and the plurality of third pixels P3 are spaced apart from each other with the first pixel P1 therebetween.

The plurality of first pixels P1 and the plurality of third pixels P3 may be alternately arranged in a first direction and a second direction crossing with the first direction. The first pixel P1 may be surrounded by the plurality of second pixels P2 and the plurality of third pixels P3.

Though it is shown in FIG. 2A that the first pixel P1, the second pixel P2, and the third pixel P3 are arranged in a pentile structure, the present disclosure is not limited thereto.

Figure 2B:
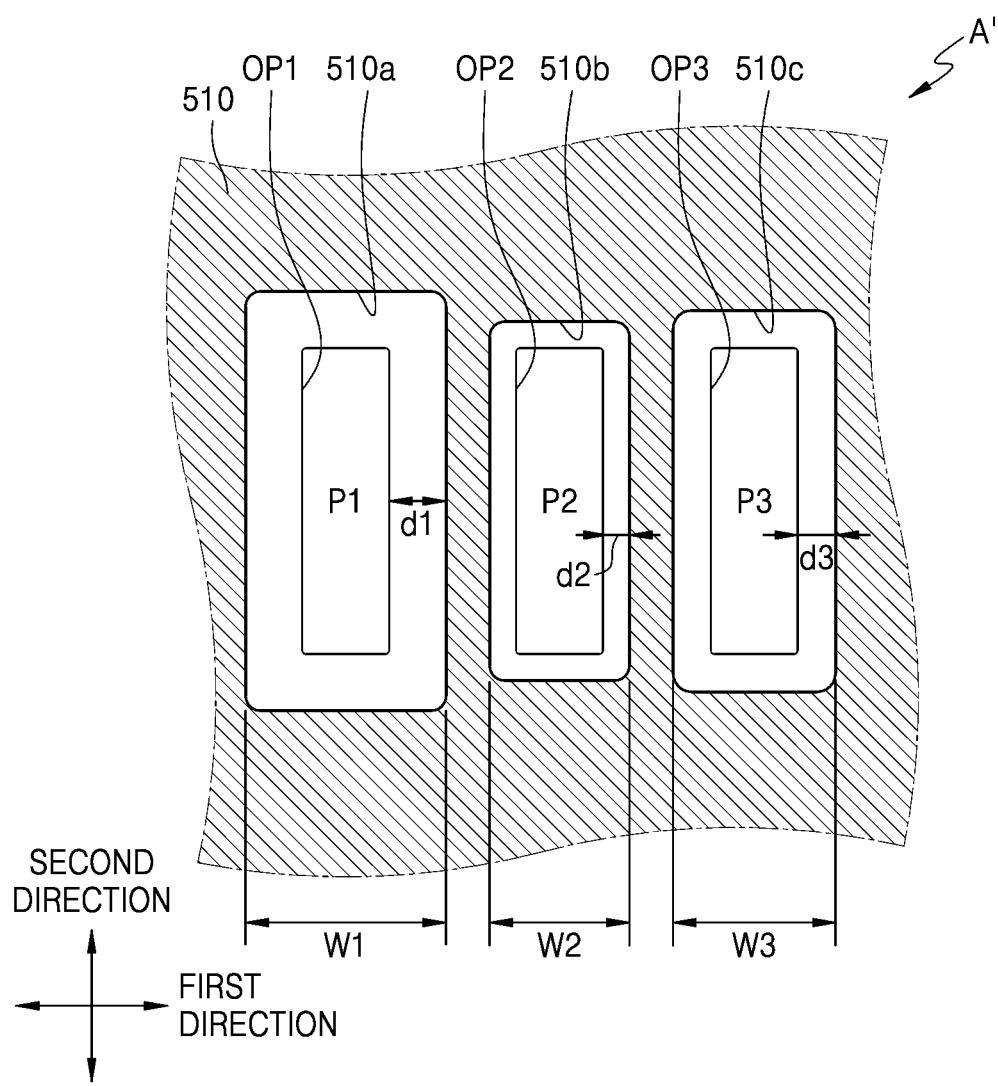
FIG. 2B is an enlarged plan view, according to some example embodiments, of region A of FIG. 1.

For example, as shown in FIG. 2B, the first pixel P1, the second pixel P2, and the third pixel P3 may be arranged in a stripe structure. That is, the first pixel P1, the second pixel P2, and the third pixel P3 may be sequentially arranged in the first direction. The organic light-emitting display apparatus according to the present embodiment may include the first pixel P1, the second pixel P2, and the third pixel P3 respectively emitting different colors and include the upper openings 510a, 510b, and 510c respectively surrounding the first pixel P1, the second pixel P2, and the third pixel P3.

According to some example embodiments, the areas of the first pixel P1, the second pixel P2, and the third pixel P3 may be the same. However, it is not limited thereto. The areas of the first pixel P1, the second pixel P2, and the third pixel P3 may be different.

According to some example embodiments, at least one of the first distance d1, the second distance d2, and the third distance d3, which are the horizontal spaced distances between the edges of the first pixel P1, the second pixel P2, and the third pixel P3, and the inner edges of the upper openings 510a, 510b, and 510c, may be different.

According to some example embodiments, the first upper opening 510a, the second upper opening 510b, and the third upper opening 510c may respectively have different sizes. For example, in the case where the first upper opening 510a, the second upper opening 510b, and the third upper opening 510c are provided in a quadrangular shape, at least one of widths W1, W2, and W3 of inner short sides of the first upper opening 510a, the second upper opening 510b, and the third upper opening 510c may be different.

Hereinafter, an organic light-emitting display apparatus according to some example embodiments is described in more detail according to a stacking sequence shown in FIG. 3.

Figure 4:
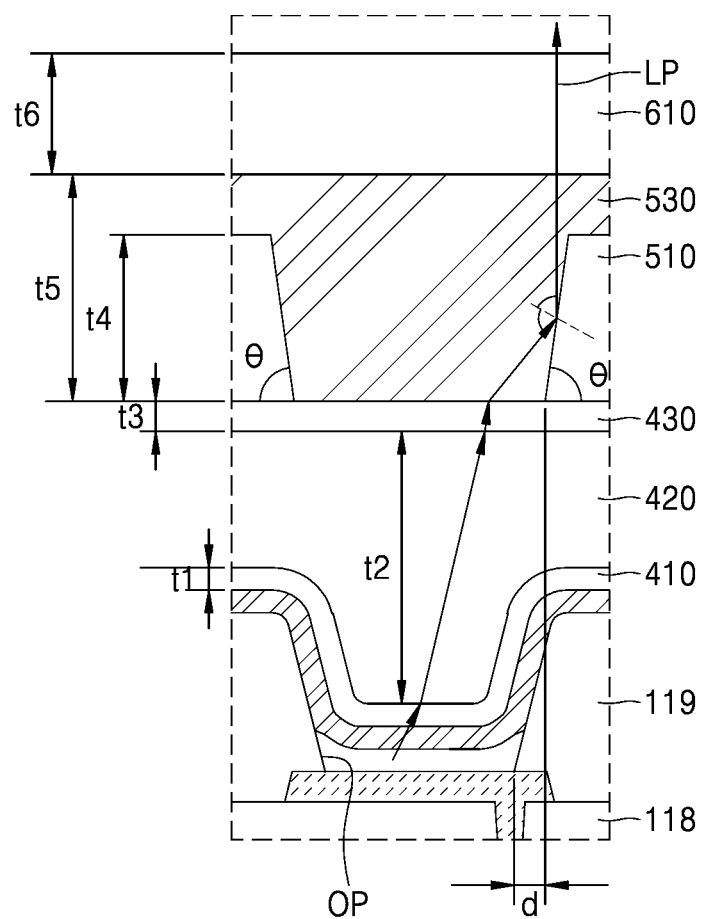
FIG. 4 is an enlarged cross-sectional view of region B of FIG. 3 according to some example embodiments.

FIG. 3 is a cross-sectional view taken along the line I-I' of FIG. 2A and a cross-sectional view of a portion of a peripheral area of an organic light-emitting display apparatus, and FIG. 4 is an enlarged cross-sectional view of an area B of FIG. 3.

Referring to FIG. 3, an organic light-emitting display apparatus according to some example embodiments includes the plurality of pixels P1, P2, and P3 implemented as a plurality of organic light-emitting diodes OLED, a thin-film encapsulation layer 400 covering the plurality of organic light-emitting diodes OLED, the total reflective layer 510 arranged on the thin-film encapsulation layer 400 and including the upper openings (also referred to as total reflective structures) 510a, 510b, and 510c, and a planarization layer 530 covering the total reflective layer 510 and having a refractive index higher than those of the total reflective structures 510a, 510b, and 510c.

Meanwhile, though one thin film transistor T1 and one storage capacitor Cst of a pixel circuit configured to drive the organic light-emitting diode OLED are shown, the present disclosure is not limited thereto. The number of thin film transistors may be two to seven and may be variously changed. For convenience of description, a configuration arranged in the display area DA of FIG. 4 is described according to a stacking sequence.

The substrate 100 may include a glass material, a ceramic material, a metal material, or a flexible or bendable material. In the case where the substrate 100 includes the flexible or bendable material, the substrate 100 may include a polymer resin such as polyethersulfone (PES), polyacrylate polyetherimide (PEI), polyethylene naphthalate (PEN), polyethylene terephthalate (PET), polyphenylene sulfide (PPS), polyarylate (PAR), polyimide (PI), polycarbonate (PC), and cellulose acetate propionate (CAP). The substrate 100 may include a single layer or a multi-layer including the above materials. In the case where the substrate 100 includes a multi-layer, the substrate 100 may further include an inorganic layer. According to some example embodiments, the substrate 100 may have a structure of an organic material/inorganic material/organic material.

A buffer layer 111 may be located on the substrate 100, may reduce or block penetration of foreign substance, moisture, or external air from below the substrate, and provide a flat surface. The buffer layer 111 may include an inorganic material such as an oxide or a nitride, or an organic material, or an organic/inorganic composite material, and may have a single-layered or multi-layered structure including an inorganic material and an organic material.

A barrier layer may be further arranged between the substrate 100 and the buffer layer 111. The barrier layer may prevent or minimize or reduce penetration of impurities from the substrate 100, etc. into a semiconductor layer A1. The barrier layer may include an inorganic material such as an oxide or a nitride, or an organic material, or an organic/inorganic composite material, and may have a single-layered or multi-layered structure including an inorganic material and an organic material.

The semiconductor layer A1 may be arranged on the buffer layer 111. The semiconductor layer A1 may include amorphous silicon or polycrystalline silicon. According to some example embodiments, the semiconductor layer A1 may include an oxide of at least one of In, Ga, Sn, Zr, V, Hf, Cd, Ge, Cr, Ti, Al, Cs, Ce, and Zn. According to some example embodiments, the semiconductor layer A1 may include, as a Zn oxide-based material, Zn oxide, In—Zn oxide, and Ga—In—Zn oxide. According to some example embodiments, the semiconductor layers A1 may include a semiconductor including IGZO(In—Ga—Zn—O), ITZO (In—Sn—Zn—O), or IGTZO(In—Ga—Sn—Zn—O) in which ZnO contains metal such as In, Ga, or Sn. The semiconductor layer A1 may include a channel region, and a source region and a drain region respectively arranged on two opposite sides of the channel region. The semiconductor layer A1 may include a single layer or a multi-layer.

A gate electrode G1 is arranged over the semiconductor layer A1 with a first gate insulating layer 112 therebetween such that the gate electrode G1 overlaps at least a portion of the semiconductor layer A1. The gate electrode G1 may include at least one of Mo, Al, Cu, and Ti, and may include a single layer or a multi-layer. For example, the gate electrode G1 may include a single layer including Mo.

The first gate insulating layer 112 may include $SiO_2$, SiNx, SiON, $Al_2O_3$, $TiO_2$, $Ta_2O_5$, $HfO_2$, or $ZnO_2$.

A second gate insulating layer 113 may be provided to cover the gate electrode G1. The second gate insulating layer 113 may include $SiO_2$, SiNx, SiON, $Al_2O_3$, $TiO_2$, $Ta_2O_5$, $HfO_2$, or $ZnO_2$.

A first electrode CE1 of the storage capacitor Cst may overlap the thin film transistor T1. For example, the gate electrode G1 of the thin film transistor T1 may serve as the first electrode CE1 of the storage capacitor Cst.

A second electrode CE2 of the storage capacitor Cst overlaps the first electrode CE1 with the second gate insulating layer 113 therebetween. In this case, the second gate insulating layer 113 may serve as a dielectric layer of the storage capacitor Cst. The second electrode CE2 may include a conductive material including at least one of Mo, Al, Cu, and Ti, and include a single layer or a multi-layer including the above materials. For example, the second electrode CE2 may include a single layer of Mo or a multi-layer of Mo/Al/Mo.

Though it is shown in the drawing that the storage capacitor Cst overlaps the thin film transistor T1, the present disclosure is not limited thereto. The storage capacitor Cst may not overlap the thin film transistor T1 and various modifications may be made.

An interlayer insulating layer 115 may be provided to cover the second electrode CE2 of the storage capacitor Cst. The interlayer insulating layer 115 may include $SiO_2$, SiNx, SiON, $Al_2O_3$, $TiO_2$, $Ta_2O_5$, $HfO_2$, or $ZnO_2$.

A source electrode S1 and a drain electrode D1 are arranged on the interlayer insulating layer 115. The source electrode S1 and the drain electrode D1 may include a conductive material including Mo, Al, Cu, Ti, and include a single layer or a multi-layer including the above materials. For example, the source electrode S1 and the drain electrode D1 may have a multi-layered structure including Ti/AlF/Ti.

A via layer 117 may be located on the source electrode S1 and the drain electrode D1. An organic light-emitting diode OLED may be located on the via layer 117.

The via layer 117 may have a flat top surface such that a pixel electrode 310 is formed flat. The via layer 117 may include a single layer or a multi-layer including an organic material. The via layer 117 may include a general-purpose polymer such as benzocyclobutene (BCB), polyimide, hexamethyldisiloxane (HMDSO), polymethylmethacrylate (PMMA) or polystyrene (PS), or polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The via layer 117 may include an inorganic material. The via layer 117 may include $SiO_2$, $SiNx$, $SiON$, $Al_2O_3$, $TiO_2$, $Ta_2O_5$, $HfO_2$, or $ZnO_2$. In the case where the via layer 117 includes an inorganic material, chemical planarization polishing may be performed depending on a case. Meanwhile, the via layer 117 may include both an organic material and an inorganic material.

The organic light-emitting diode OLED is arranged on the via layer 117 in the display area DA of the substrate 100. The organic light-emitting diode OLED includes the pixel electrode 310, an intermediate layer 320 including an organic emission layer, and an opposite electrode 330.

The via layer 117 includes a via hole exposing one of the source electrode S1 and the drain electrode D1 of the thin film transistor T1, and the pixel electrode 310 is electrically connected to the thin film transistor T1 by contacting the source electrode S1 or the drain electrode D1 through the via hole.

The pixel electrode 310 may include a (semi) transparent electrode or a reflective electrode. According to some example embodiments, the pixel electrode 310 may include a reflective layer including Ag, Mg, Al, Pt, Pd, Au, Ni, Nd, Ir, Cr, or a compound thereof, and a transparent or semi-transparent electrode layer on the reflective layer. The transparent or semi-transparent electrode layer may include at least one of indium tin oxide (ITO), zinc oxide (IZO), zinc oxide (ZnO), indium oxide ($In_2O_3$), indium gallium oxide (IGO), and aluminum zinc oxide (AZO). According to some example embodiments, the pixel electrode 310 may have a stacked structure of ITO/Ag/ITO.

A pixel-defining layer 119 may be arranged on the via layer 117. The pixel-defining layer 119 may define emission areas respectively of the pixels P1, P2, and P3 by including openings respectively corresponding to pixel electrodes 310 in the display area DA, that is, a first opening OP1, a second opening OP2, and a third opening OP3 that respectively expose at least central portions of the pixel electrodes 310. Also, the pixel-defining layer 119 may prevent or reduce instances of an arc, etc. occurring at an edge of the pixel electrode 310 by increasing a distance between the edge of the pixel electrode 310 and the opposite electrode 330 over the pixel electrode 310. The pixel-defining layer 119 may include an organic insulating material such as polyimide, polyamide, an acrylic resin, BCB, polyimide, HMDSO, and a phenolic resin and may be formed by spin coating, etc.

The first pixel P1 may be defined by the first opening OP1 of the pixel-defining layer 119, the second pixel P2 may be defined by the second opening OP2 of the pixel-defining layer 119, and the third pixel P3 may be defined by the third opening OP3 of the pixel-defining layer 119. That is, edges of the pixels, that is, the first pixel P1, the second pixel P2, and the third pixel P3 may respectively denote edges of the openings OP, that is, the first opening OP1, the second opening OP2, and the third opening OP3 of the pixel-defining layer 119. Also, the edges of the openings OP, that is, the first opening OP1, the second opening OP2, and the third opening OP3 of the pixel-defining layer 119 may denote boundaries of the pixel electrodes 310 that are exposed by the openings OP.

The intermediate layer 320 of the organic light-emitting diode OLED may include the organic emission layer. The organic emission layer may include an organic material including a fluorescent or phosphorescent material which emits red, green, blue, or white light. The organic emission layer may include a low molecular weight or polymer organic material. A functional layer such as a hole transport layer (HTL), a hole injection layer (HIL), an electron transport layer (ETL), and an electron injection layer (EIL) may be selectively further arranged under and on the organic emission layer. The intermediate layer 320 may correspond to each of the plurality of pixel electrodes 310. However, the intermediate layer 320 is not limited thereto. The intermediate layer 320 may include a layer that is one body over the plurality of pixel electrodes 310. Various modifications may be made.

The opposite electrode 330 may include a light-transmissive electrode or a reflective electrode. According to some example embodiments, the opposite electrode 330 may include a transparent or semi-transparent electrode and may include a metal thin film having a small work function and including one of Li, Ca, LiF/Ca, LiF/Al, Al, Ag, Mg, and a compound thereof. Also, a transparent conductive oxide (TCO) layer such as ITO, IZO, ZnO, or $In_2O_3$ may be further arranged on the metal thin film. The opposite electrode 330 may be arranged over the display area DA and the peripheral area PA and arranged over the intermediate layer 320 and the pixel-defining layer 119. The opposite electrode 330 may be provided as one body over a plurality of organic light-emitting diodes OLED and may correspond to the plurality of pixel electrodes 310.

In the case where the pixel electrode 310 includes a reflective electrode and the opposite electrode 330 includes a light-transmissive electrode, light emitted from the intermediate layer 320 may be emitted toward the opposite electrode 330 and a display apparatus may become a top-emission display apparatus. In the case where the pixel electrode 310 includes a transparent or semi-transparent electrode and the opposite electrode 330 includes a reflective electrode, light emitted from the intermediate layer 320 may be emitted toward the substrate 100 and a display apparatus may become a bottom-emission display apparatus. However, embodiments are not limited thereto. A display apparatus according to some example embodiments may be a dual-emission display apparatus which emits light in two directions of a top direction and a bottom direction.

The thin-film encapsulation layer 400 may prevent or reduce instances of penetration of external moisture and oxygen by covering the display area DA and the peripheral area PA. The thin-film encapsulation layer 400 may include at least one organic encapsulation layer and at least one inorganic encapsulation layer. Though it is shown in FIG. 3 that the thin-film encapsulation layer 400 includes two inorganic encapsulation layers, for example, the first and second inorganic encapsulation layers 410 and 430, and one organic encapsulation layer 420, a stacking sequence and the number of times layers are stacked are not limited to the embodiment shown in FIG. 3.

The first inorganic encapsulation layer 410 may cover the opposite electrode 330 and include silicon oxide, silicon nitride and/or silicon oxynitride. When needed, other layers such as a capping layer may be arranged between the first inorganic encapsulation layer 410 and the opposite electrode 330. Because the first inorganic encapsulation layer 410 is formed along a structure thereunder, a top surface thereof is not flat as shown in FIG. 3. The organic encapsulation layer 420 covers the first inorganic encapsulation layer 410. Unlike the first inorganic encapsulation layer 410, a top surface of the organic encapsulation layer 420 may be approximately flat. Specifically, the top surface of the organic encapsulation layer 420 that corresponds to the display area DA may be approximately flat. The organic encapsulation layer 420 may include at least one of PET, PEN, PC, PI, polyethylene sulfonate, polyoxymethylene, polyarylate, and HMDSO. The second inorganic encapsulation layer 430 may cover the organic encapsulation layer 420 and include silicon oxide, silicon nitride and/or silicon oxynitride.

As described above, because the thin-film encapsulation layer 400 includes the first inorganic encapsulation layer 410, the organic encapsulation layer 420, and the second inorganic encapsulation layer 430, even when a crack occurs inside the thin-film encapsulation layer 400, cracks that have occurred between the first inorganic encapsulation layer 410 and the organic encapsulation layer 420 and between the organic encapsulation layer 420 and the second inorganic encapsulation layer 430 may not be connected to each other through such a multi-layered structure. Through this, forming of a path through which external moisture or oxygen may penetrate into the display area DA and the peripheral area PA may be prevented or minimized or reduced. The second inorganic encapsulation layer 430 may allow the organic encapsulation layer 420 not to be exposed to the outside by contacting the first inorganic encapsulation layer 410 at an edge of the second inorganic encapsulation layer 430 located outside the display area DA.

A dam unit 120 may be arranged in the peripheral area PA. The dam unit 120 may be spaced apart from the via layer 117 and the pixel-defining layer 119 and may prevent or reduce instances of an organic material flowing to an edge of the substrate 100 while the organic encapsulation layer 420 of the thin-film encapsulation layer 400 is formed. In the case where the dam unit 120 is provided as a plurality of dam units, the plurality of dam units may be spaced apart from each other.

The dam unit 120 may include a single layer or a multi-layered structure. As shown, the dam unit 120 may have a structure in which a first layer 120a and a second layer 120b are stacked. In this case, the first layer 120a may be simultaneously provided with the via layer 117 and may include the same material as that of the via layer 117, and the second layer 120b may be simultaneously provided with the pixel-defining layer 119 and may include the same material as that of the pixel-defining layer 119.

Outside the dam unit 120, because the first inorganic encapsulation layer 410 and the second inorganic encapsulation layer 430 of the thin-film encapsulation layer 400 directly contact each other, the organic encapsulation layer 420 may not be exposed to the outside. That is, penetration of external air or moisture through the organic material may be prevented or reduced.

The total reflective layer 510 including the upper openings 510a, 510b, and 510c is arranged on the thin-film encapsulation layer 400 in the display area DA. In a top view as shown in FIGS. 2A and 2B, the upper openings 510a, 510b, and 510c may be arranged to respectively surround the first pixel P1, the second pixel P2, and the third pixel P3.

Meanwhile, as shown in FIG. 3, in a cross-sectional shape of the upper openings 510a, 510b, and 510c, an inner wall of the upper openings 510a, 510b, and 510c has a tapered inclination. That is, a width of the upper openings 510a, 510b, and 510c may gradually increase in a direction away from the substrate 100.

Meanwhile, the planarization layer 530 may be arranged on the thin-film encapsulation layer 400 to cover the total reflective layer 510. The planarization layer 530 may be arranged inside the upper openings 510a, 510b, and 510c. The planarization layer 530 may include a material having a refractive index n2 higher than a refractive index n1 of the total reflective layer 510 to allow light emitted from the organic light-emitting diode OLED to be totally reflected by the total reflective layer 510. That is, because a relative refractive index of the total reflective layer 510 to the planarization layer 530 is less than 1, total internal reflection may occur on inner inclinations of the upper openings 510a, 510b, and 510c of the total reflective layer 510.

The total reflective layer 510 may include a material having a refractive index n1 ranging from about 1.4 to about 1.55. For example, the total reflective layer 510 may include an acrylic-based organic material having the refractive index n1 ranging from about 1.4 to about 1.55.

The planarization layer 530 may include a material having a refractive index n2 ranging from about 1.6 to about 1.85. For example, the planarization layer 530 may include an organic material having the refractive index n2 ranging from about 1.6 to about 1.85.

An angle θ formed by inner tapered inclination of the upper openings 510a, 510b, and 510c and a top surface of the thin-film encapsulation layer 400 may be configured such that total internal reflection of light emitted from the organic light-emitting diode OLED occurs. That is, the angle θ of the inner tapered inclination of the upper openings 510a, 510b, and 510c meets Condition 1 below. The angle θ of the tapered inclination denotes an angle formed by a bottom surface of the total reflective layer 510 and a lateral wall of the upper openings 510a, 510b, and 510c.

$$\theta > \sin^{-1}\left(\frac{n_1}{n_2}\right) \quad \text{Condition 1}$$

($n_1$: a refractive index of the total reflective layer, $n_2$: a refractive index of the planarization layer)

Meanwhile, a first angle θ1 formed by an inner tapered inclination of the first upper opening 510a and the top surface of the thin-film encapsulation layer 400, a second angle θ2 formed by an inner tapered inclination of the second upper opening 510b and the top surface of the thin-film encapsulation layer 400, and a third angle θ3 formed by an inner tapered inclination of the third upper opening 510c and the top surface of the thin-film encapsulation layer 400 may be substantially the same. However, the present disclosure is not limited thereto. At least one of the first angle θ1, the second angle θ2, and the third angle θ3 may be different.

A window 610 may be arranged on the planarization layer 530. The window 610 may include transparent glass or plastic as an organic transparent base material.

In the present embodiment, horizontal spaced distances d1, d2, and d3 between the inner edges of the upper openings 510a, 510b, and 510c, and the edges of the first pixel P1, the second pixel P2, and the third pixel P3 may be different depending on colors of the first pixel P1, the second pixel P2, and the third pixel P3. Here, the horizontal spaced distances d1, d2, and d3 may denote distances spaced apart along a top surface of the substrate 100.

For example, the first distance d1, which is the horizontal spaced distance between the edge of the first opening OP1 and the inner edge of the first upper opening 510a, may be different from the second distance d2, which is the horizontal spaced distance between the edge of the second opening OP2 and the inner edge of the second upper opening 510b. Also, the first distance d1 may be different from the third distance d3, which is the horizontal spaced distance between the edge of the third opening OP3 and the inner edge of the third upper opening 510c. Meanwhile, the second distance d2 may be different from the third distance d3.

That is, at least one of the first distance d1, the second distance d2, and the third distance d3 may be different. In an embodiment, the first distance d1, the second distance d2, and the third distance d3 may be provided based on a relation of d1>d3>d2. In an embodiment, the first distance d1, the second distance d2, and the third distance d3 may be adjusted within a value greater than 0, for example, within a range from about 0.5 μm to about 12 μm.

In the present embodiment, the first upper opening 510a, the second upper opening 510b, and the third upper opening 510c may respectively have different sizes. For example, in the case where the upper openings 510a, 510b, and 510c are provided in a quadrangular shape, at least one of widths W1, W2, and W3 of one sides of the upper openings 510a, 510b, and 510c may be different. In an embodiment, the inner width W1 of the first upper opening 510a, the inner width W2 of the second upper opening 510b, and the inner width W3 of the third upper opening 510c may be provided based on a relation of W1>W3>W2. This may mean that the first upper opening 510a, the second upper opening 510b, and the third upper opening 510c may respectively have different areas.

A light efficiency of emitting light to the front may be increased by the inner lateral walls of the upper openings 510a, 510b, and 510c, but in the case where the spaced distances between the upper openings 510a, 510b, and 510c, and the pixels P1, P2, and P3 and/or the sizes of the upper openings 510a, 510b, and 510c are the same, a disadvantage may occur in a white angle difference (WAD). For example, when the organic light-emitting display apparatus is viewed from a lateral side, a brightness change amount may be different for every color and a specific color may be more conspicuous.

Some example embodiments may improve a front light efficiency and reduce a WAD by making different spaced distances between the upper openings 510a, 510b, and 510c, and the pixels P1, P2, and P3 and/or the sizes of the upper openings 510a, 510b, and 510c for each pixel.

FIG. 4 is an enlarged cross-sectional view of an area B of FIG. 3.

Referring to FIG. 4, a light path LP of light emitted from the organic light-emitting diode OLED sequentially progresses through the first inorganic encapsulation layer 410, the organic encapsulation layer 420, the second inorganic encapsulation layer 430, and the planarization layer 530, and the light may be reflected by the inner tapered inclination of the second upper opening 510b of the total reflective layer 510 and emitted to the outside.

The first inorganic encapsulation layer 410 may have a thickness t1 ranging from about 0.3 μm to about 0.6 μm and have a refractive index ranging from about 1.7 to about 1.9. In the above of the emission area of the pixel, the organic encapsulation layer 420 may have a thickness t2 ranging from about 5 μm to about 10 μm and have a refractive index n3 ranging from about 1.4 to about 1.6. The second inorganic encapsulation layer 430 may have a thickness t3 ranging from about 0.3 μm to about 0.6 μm and have a refractive index ranging from about 1.7 to about 1.9.

The total reflective layer 510 may have a thickness t4 ranging from about 1 μm to about 8 μm and have a refractive index n1 ranging from about 1.4 to about 1.55. In the above of the emission area of the pixel, a thickness t5 of the planarization layer 530 may be a thickness that may cover the total reflective layer 510, may be about 1 μm to about 2 μm greater than the thickness of the total reflective layer 510, and may have a refractive index n2 ranging from about 1.6 to about 1.85.

The window 610 may have a thickness t6 ranging from about 0.5 μm to about 1 mm and have a refractive index ranging from about 1.4 to about 1.6.

In an embodiment, a refractive index of the second inorganic encapsulation layer 430 may be greater than a refractive index of the planarization layer 530. For example, the refractive index of the second inorganic encapsulation layer 430 may be about 1.9, and the refractive index of the planarization layer 530 may be about 1.8.

A maximum value dmax of a horizontal distance 'd' between the edge of the opening OP and the edge of the upper opening 510b may meet Condition 2 below.

$$d\max = t2\tan\left(\sin^{-1}\left(\frac{n2}{n3}\sin(\pi - 2\theta)\right)\right) \quad \text{Condition 2}$$

(t2: a thickness of the organic encapsulation layer, n3: a refractive index of the organic encapsulation layer, n2: a refractive index of the planarization layer)

Figure 5:
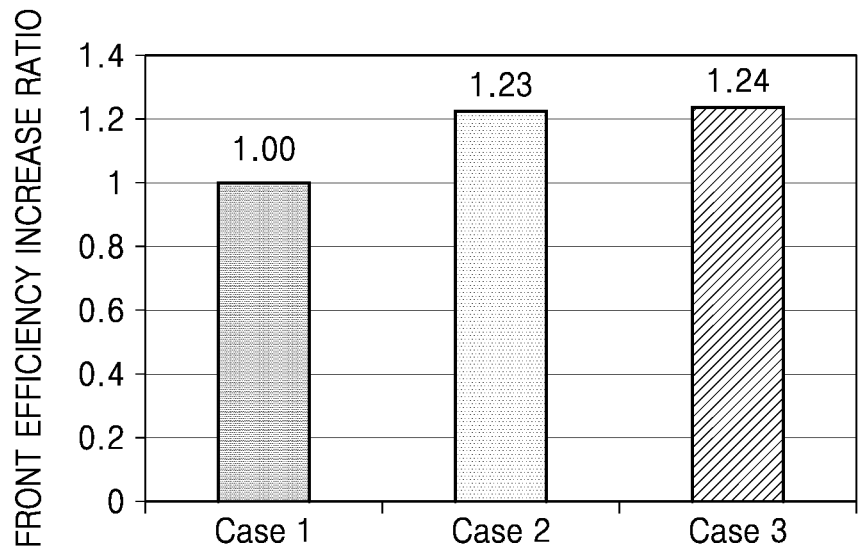
FIG. 5 is a graph showing a front light efficiency increase ratio for case 1 where a total reflective layer is not employed, for case 2 where a total reflective layer including upper openings having the same size is employed, for case 3 where a total reflective layer including different upper openings for each pixel according to some example embodiments.

That is, the horizontal distance 'd' between the edge of the opening OP and the edge of the upper opening 510b may have a range of 0<d≤dmax FIG. 5 is a graph showing a front light efficiency increase ratio for case 1 where a total reflective layer is not employed, for case 2 where a total reflective layer including upper openings having the same size is employed, for case 3 where a total reflective layer including different upper openings for each pixel.

Case 1 represents the case where the total reflective layer is not employed and serves as a reference value of the front light efficiency.

Case 2 represents the case where sizes of the upper openings are the same for each pixel. In the present graph, the widths W1, W2, and W3 of the upper openings surrounding the first pixel P1, the second pixel P2, and the third pixel P3 have been set such that W1=W2=W3=22 μm. In this case, the front light efficiency is 1.23 compared to the case where the total reflective layer is not employed, which shows that the front light efficiency increases.

Case 3 represents the case where sizes of the upper openings are different for each pixel. In the present graph, the widths W1, W2, and W3 of the upper openings surrounding the first pixel P1, the second pixel P2, and the third pixel P3 have been set such that W1=22 μm, W2=16 μm, and W3=24 μm. In this case, the front light efficiency is 1.24 compared to the case where the total reflective layer is not employed, which shows that the front light efficiency increases.

That is, it is revealed that in the case where the total reflective structures are employed, the front light efficiency increases compared to the case where the total reflective structures are not employed.

Figure 6:
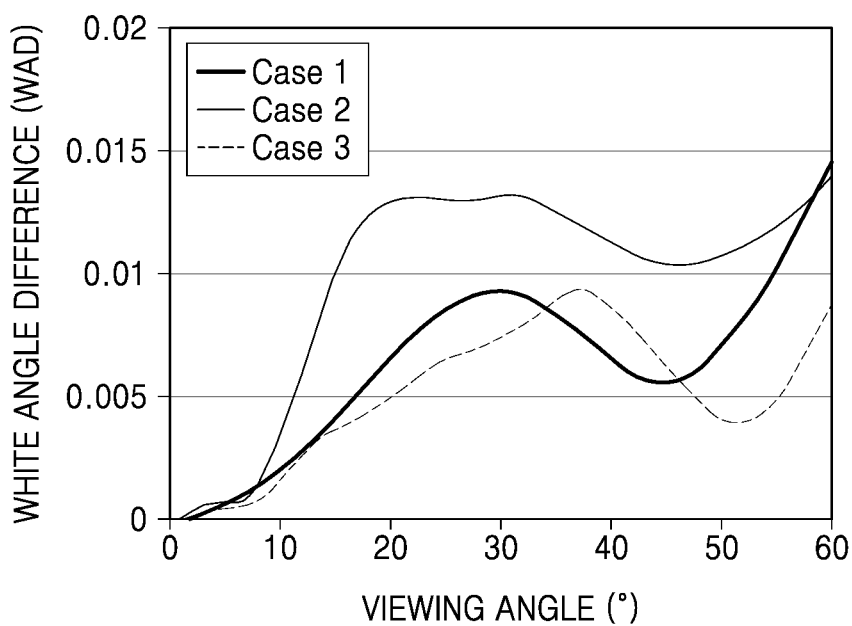
FIG. 6 is a graph showing a white angle difference (WAD) for case 1 where a total reflective layer is not employed, for case 2 where a total reflective layer including upper openings having the same size is employed, for case 3 where a total reflective layer including different upper openings for each pixel is employed according to some example embodiments.

FIG. 6 is a graph showing a white angle difference (WAD) for case 1 where a total reflective layer is not employed, for case 2 where a total reflective layer including upper openings having the same size is employed, for case 3 where a total reflective layer including different upper openings for each pixel is employed.

Referring to FIG. 6, it is revealed that case 3 where the total reflective layer including the different upper openings for each pixel is employed rather than case 2 where the total reflective layer including the upper openings having the same size is employed, has a WAD similar to that of case 1 where the total reflective layer is not employed.

That is, in case 2 where the total reflective layer including the upper openings having the same size is employed, a brightness change or color change depending on a viewing angle may be severe compared to other cases.

Referring to FIGS. 5 and 6, it is revealed that when a total reflective layer having upper openings is employed, a front light efficiency increases, but when the upper openings are equally applied for each pixel, a disadvantage may occur in a WAD.

Meanwhile, it is revealed that in the case where the sizes of the upper openings are applied different for each pixel, the front light efficiency may be increased and simultaneously a WAD may be reduced.

Figure 7:
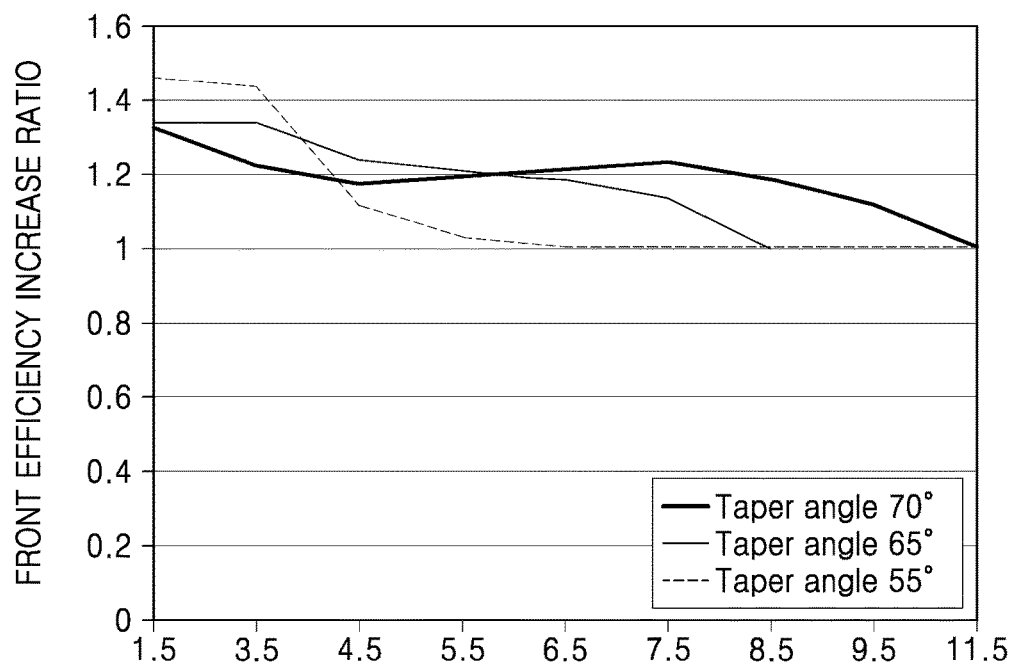
FIG. 7 is a graph showing a front light efficiency increase ratio depending on a upper opening and a horizontal spaced distance between pixels according to some example embodiments.
Figure 8:
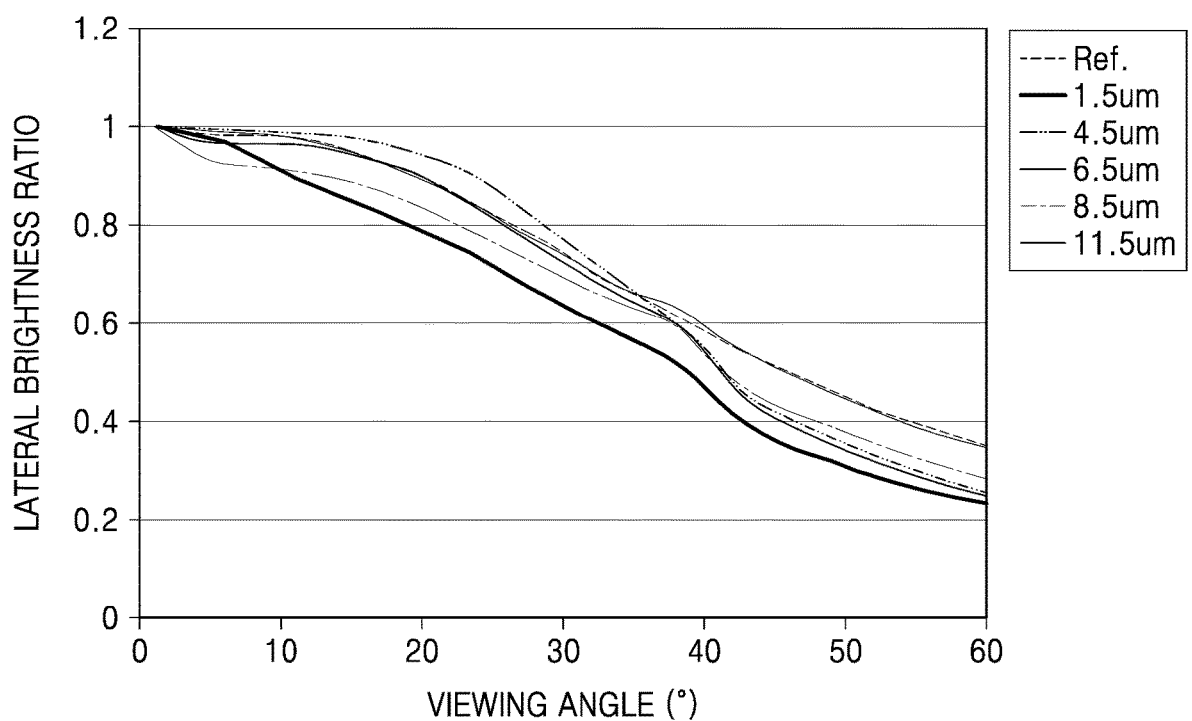
FIG. 8 is a graph showing a lateral brightness ratio depending on a horizontal spaced distance for the case where a tapered inclination angle of a upper opening is 70° according to some example embodiments.

FIG. 7 is a graph showing a front light efficiency increase ratio depending on a upper opening and a horizontal spaced distance between pixels for the case where tapered inclination angles of the upper openings is 55°, 65°, and 70°, and FIG. 8 is a graph showing a lateral brightness ratio depending on a horizontal spaced distance for the case where a tapered inclination angle of a upper opening is 70°. In this case, the measured pixel is a pixel emitting green light.

First, referring to FIG. 7, it is revealed that in the case where a tapered inclination angle of a upper opening is 70°, a front light efficiency is about 1.2 while the horizontal spaced distance 'd' is in the range from about 1.5 μm to about 8.5 μm. That is, even though the horizontal spaced distance 'd' is adjusted from about 1.5 μm to about 8.5 μm, an increase amount of the front light efficiency is constant to some degree.

Referring to FIG. 8, it is revealed that when a horizontal spaced distance is adjusted from about 1.5 μm to about 8.5 μm, a lateral brightness ratio is distributed different depending on a viewing angle. Based on this, to reduce green light when an organic light-emitting display apparatus is viewed at a viewing angle of 30°, a horizontal spaced distance may be set to d=1.5 μm such that a lateral brightness ratio is low. Meanwhile, to increase green light at a viewing angle of 30°, a horizontal spaced distance may be set to d=6.5 μm.

Graphs of FIGS. 5 to 8 show that a front light efficiency may be improved and a WAD may be reduced by providing different spaced distances between the upper openings 510a, 510b, and 510c, and the pixels P1, P2, and P3, and/or different sizes of the upper openings 510a, 510b, and 510c for respective pixels P1, P2, and P3.

Figure 9A:
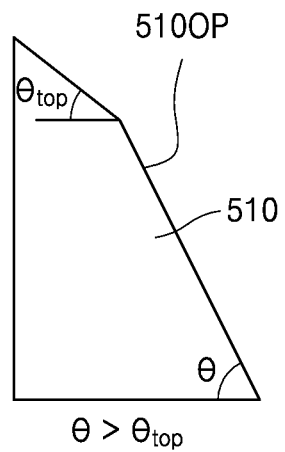
FIGS. 9A to 9C are cross-sectional views of an inner inclination structure of an upper opening according to some example embodiments.
Figure 9B:
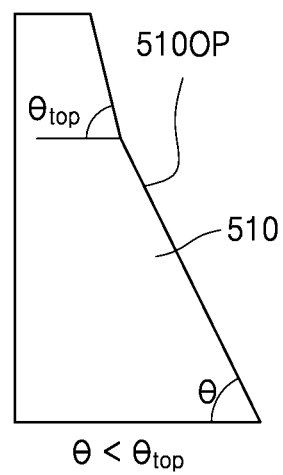
Figure 9C:
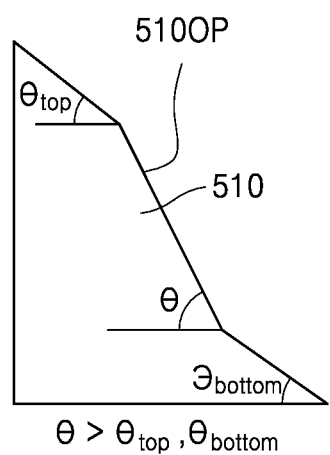

FIGS. 9A to 9C are cross-sectional views of an inner inclination structure of a upper opening applicable to embodiments.

Referring to FIGS. 9A to 9C, an inner inclination of a upper opening 510OP includes a main inclination having an angle θ. The inner inclination of the upper opening 510OP may denote an angle formed by a bottom surface of the total reflective layer 510 and a lateral wall of the upper opening 510OP. As shown in FIG. 3, the upper opening 510OP may include only a main inclination having the angle θ, but is not limited thereto.

As shown in FIG. 9A, the upper opening 510OP may further include an upper inclination having an angle $θ_{top}$ less than the angle θ on the main inclination having the angle θ.

Alternatively, as shown in FIG. 9B, the upper opening 510OP may further include an upper inclination having an angle $θ_{top}$ greater than the angle θ on the main inclination having the angle θ.

Meanwhile, as shown in FIG. 9C, the upper opening 510OP may further include an upper inclination having an angle $θ_{top}$ less than the angle θ on the main inclination having the angle θ and include a lower inclination having an angle $θ_{bottom}$ less than the angle θ under the main inclination.

As described above, the inner wall of the upper opening 510OP may further include another inclination structure having an angle different from that of the main inclination in addition to the main inclination having the angle θ. Because the angle θ of the main inclination may meet Condition 1, total internal reflection may occur on the inclination surface thereof. The upper opening 510OP may represent one of the first upper opening 510a, the second upper opening 510b, and the third upper opening 510c.

Figure 10:
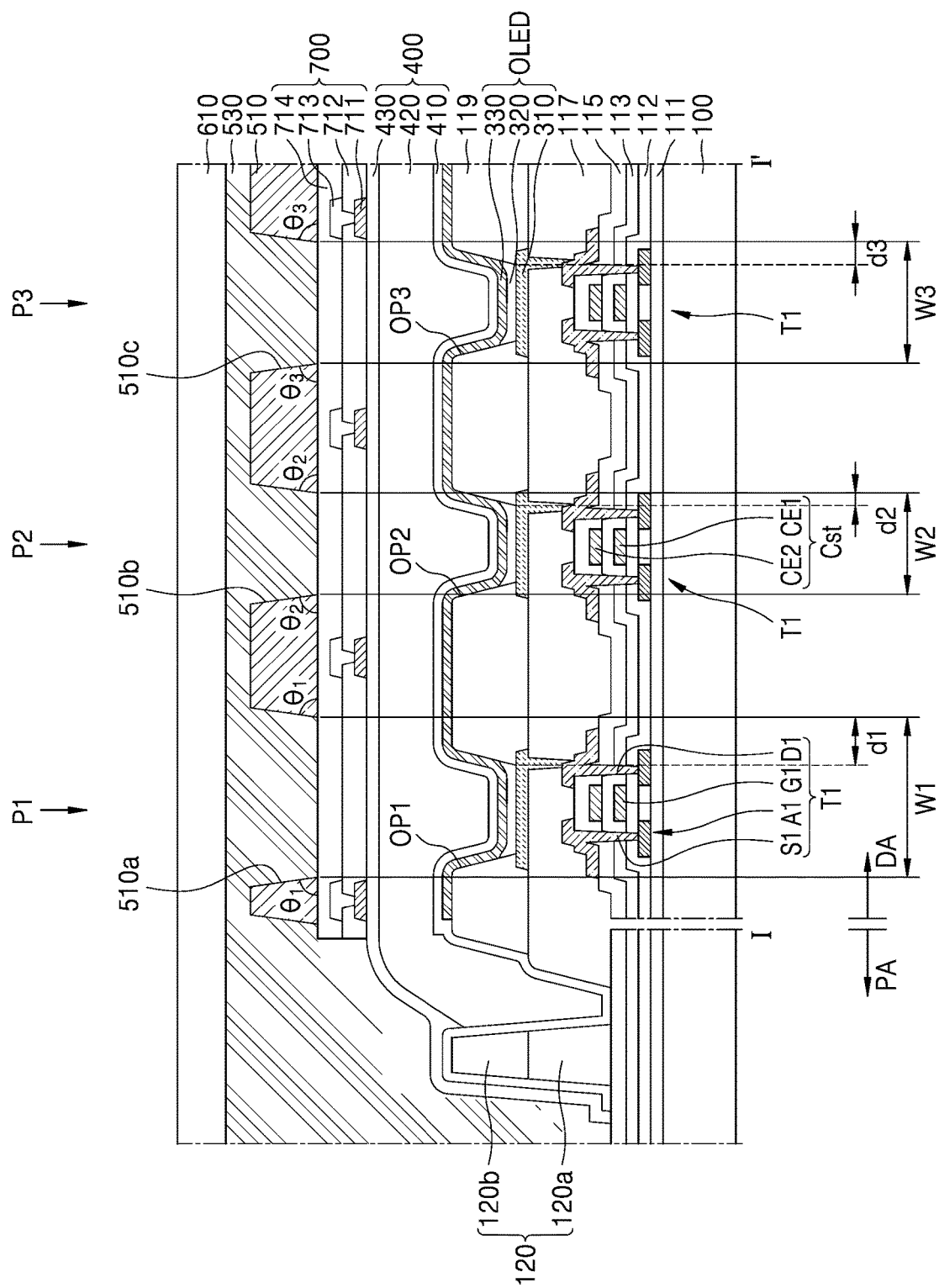
FIG. 10 is a cross-sectional view of a portion of an organic light-emitting display apparatus according to some example embodiments.

FIG. 10 is a cross-sectional view of a portion of the organic light-emitting display apparatus according to some example embodiments. In FIG. 10, because the same reference numerals as those of FIG. 3 denote the same elements, repeated description is omitted.

Referring to FIG. 10, an organic light-emitting display apparatus according to the present embodiment includes the plurality of pixels P1, P2, and P3 implemented as a plurality of organic light-emitting diodes OLED, the thin-film encapsulation layer 400 covering the plurality of organic light-emitting diodes OLED, the total reflective layer 510 arranged over the thin-film encapsulation layer 400 and including the upper openings 510a, 510b, and 510c, and the planarization layer 530 covering the total reflective layer 510 and having a refractive index higher than that of the total reflective layer 510.

According to some example embodiments, the organic light-emitting display apparatus may further include a touch-screen layer 700 between the thin-film encapsulation layer 400 and the total reflective layer 510.

The touchscreen layer 700 may be, for example, a capacitance-type touchscreen layer in which when the window 610 is touched, a change in a mutual capacitance formed between touch electrodes 711 and 713 of the touchscreen layer 700 occurs, and whether a relevant portion is touched may be determined by sensing the change. Alternatively, the touchscreen layer 700 may determine whether a touch is made in various ways, for example, when a change in a capacitance between the touch electrodes 711 and 713, and the opposite electrode 330 occurs, and whether a relevant portion is touched is determined by sensing the change.

The touchscreen layer 700 according to an embodiment may have a structure in which the first touch conductive layer 711, a first insulating layer 712, a second touch conductive layer 713, and a second insulating layer 714 are sequentially stacked. The touch electrodes 711 and 713 may include the first touch conductive layer 711 and the second touch conductive layer 713.

According to some example embodiments, the second touch conductive layer 713 may serve as a sensor configured to sense whether a touch is made, and the first touch conductive layer 711 may serve as a connector connecting, in one direction, the second touch conductive layers 713 that are patterned.

According to some example embodiments, both the first touch conductive layer 711 and the second touch conductive layer 713 may serve as sensors. For example, the first insulating layer 712 may include a via hole exposing a top surface of the first touch conductive layer 711, and the first touch conductive layer 711 and the second touch conductive layer 713 may be connected to each other through the via hole. Because the first touch conductive layer 711 and the second touch conductive layer 713 are used in this way, a resistance of the first touch conductive layer 711 and the second touch conductive layer 713 is reduced and thus a response speed of the touchscreen layer 700 may be improved.

According to some example embodiments, the touch electrodes 711 and 713 may have a mesh structure to transmit light emitted from the organic light-emitting diode OLED. Accordingly, the first touch conductive layer 711 and the second touch conductive layer 713 of the touch electrodes 711 and 713 may not overlap an emission area of the organic light-emitting diode OLED.

Each of the first touch conductive layer 711 and the second touch conductive layer 713 may include a single layer or a multi-layer including a conductive material having excellent conductivity. For example, each of the first touch conductive layer 711 and the second touch conductive layer 713 may include a single layer or a multi-layer including a transparent conductive layer and a conductive material including Al, Cu, and/or Ti. The transparent conductive layer may include a transparent conductive oxide such as ITO, IZO, ZnO, and ITZO. In addition, the transparent conductive layer may include a conductive polymer such as poly-(3,4)-ethylene-dihydroxy thiophene (PEDOT), a metal nano wire, and a graphene. In an embodiment, each of the first touch conductive layer 711 and the second touch conductive layer 713 may include a stacked structure of Ti/Al/Ti.

Each of the first insulating layer 712 and the second insulating layer 714 may include an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cesium oxide, or silicon oxynitride. The organic material may include at least one of an acrylic-based resin, a methacrylic-based resin, a polyisoprene resin, a vinyl-based resin, an epoxy-based resin, a urethane-based resin, a cellulose-based resin, and a phenylene-based resin.

According to some example embodiments, a touch buffer layer may be further arranged between the thin-film encapsulation layer 400 and the touchscreen layer 700. The touch buffer layer may prevent or reduce instances of damage of the thin-film encapsulation layer 400 and block an interference signal that may occur when the touchscreen layer 700 is driven. The touch buffer layer may include an inorganic material such as silicon oxide, silicon nitride, silicon oxynitride, aluminum oxide, aluminum nitride, titanium oxide, or titanium nitride, or an organic material such as polyimide, polyester, and acrylic, and may include a stacked body including the above materials.

Because the touch buffer layer and/or the touchscreen layer 700 is directly formed on the thin-film encapsulation layer 400 by deposition, etc., a separate adhesive layer is not required on the thin-film encapsulation layer 400. Therefore, a thickness of the display apparatus may be reduced.

The total reflective layer 510 may be arranged on the touchscreen layer 700. The upper openings 510*a*, 510*b*, and 510*c* of the total reflective layer 510 may respectively correspond to the pixels P1, P2, and P3 in a top view as in FIGS. 2A and 2B.

Meanwhile, in a cross-sectional shape of the upper openings 510*a*, 510*b*, and 510*c*, the inner wall has a tapered inclination. That is, a width of the upper opening may gradually increase in a direction away from the substrate 100.

A tapered inclination angle of the inner wall of the upper openings 510*a*, 510*b*, and 510*c* may meet Condition 1.

Meanwhile, a first angle $\theta 1$ formed by an inner tapered inclination of the first upper opening 510*a* and a top surface of the thin-film encapsulation layer 400, a second angle $\theta 2$ formed by an inner tapered inclination of the second upper opening 510*b* and the top surface of the thin-film encapsulation layer 400, and a third angle $\theta 3$ formed by an inner tapered inclination of the third upper opening 510*c* and the top surface of the thin-film encapsulation layer 400 may substantially the same and are not limited thereto. At least one of the first angle $\theta 1$, the second angle $\theta 2$, and the third angle $\theta 3$ may be different. That is, in the present embodiment, the first angle $\theta 1$, the second angle $\theta 2$, and the third angle $\theta 3$ may be the same or different within a range meeting a condition of Condition 1.

In the present embodiment, the horizontal spaced distances d1, d2, and d3 between the upper openings 510*a*, 510*b*, and 510*c* and the edges respectively of the pixels P1, P2, and P3 may be different depending on the colors respectively of the pixels P1, P2, and P3. Here, the horizontal spaced distance may denote a spaced distance along the top surface of the substrate 100.

For example, the first distance d1, which is a horizontal spaced distance between an edge of the first opening OP1 and the inner edge of the first upper opening 510*a* may be different from the second distance d2, which is a horizontal spaced distance between an edge of the second opening OP2 and the inner edge of the second upper opening 510*b*. Also, the first distance d1 may be different from the third distance d3, which is a horizontal spaced distance between an edge of the third opening OP3 and the inner edge of the third upper opening 510*c*. Meanwhile, the second distance d2 may be different from the third distance d3.

That is, at least one of the first distance d1, the second distance d2, and the third distance d3 may be different. In an embodiment, the first distance d1, the second distance d2, and the third distance d3 may be provided based on a relation of d1>d3>d2. In an embodiment, the first distance d1, the second distance d2, and the third distance d3 may be adjusted within a value greater than 0, for example, within a range from about 0.5 μm to about 12 μm.

According to some example embodiments, the first upper opening 510*a*, the second upper opening 510*b*, and the third upper opening 510*c* may respectively have different sizes. For example, in the case where the upper openings 510*a*, 510*b*, and 510*c* are provided in a quadrangular shape, at least one of widths W1, W2, and W3 of one sides of the upper openings 510*a*, 510*b*, and 510*c* may be different. In an embodiment, the inner width W1 of the first upper opening

510a, the inner width W2 of the second upper opening 510b, and the inner width W3 of the third upper opening 510c may be provided based on a relation of W1>W3>W2. This may mean that at least one of the area of the first upper opening 510a, the area of the second upper opening 510b, and the area of the third upper opening 510c may be different.

A light efficiency of emitting light to the front may be increased by the upper openings 510a, 510b, and 510c, but in the case where the spaced distances between the upper openings 510a, 510b, and 510c, and the pixels P1, P2, and P3 and/or the sizes of the upper openings 510a, 510b, and 510c are the same, a disadvantage may occur in a WAD. For example, when the organic light-emitting display apparatus is viewed from a lateral side, a brightness change amount may be different for every color and a specific color may be more conspicuous.

The present embodiment may improve a front light efficiency and reduce a WAD by making different spaced distances between the upper openings 510a, 510b, and 510c, and the pixels P1, P2, and P3 and/or the sizes of the upper openings 510a, 510b, and 510c for each pixel.

As described above, because an organic light-emitting display apparatus according to an embodiment includes a total reflective layer including upper openings, and sizes of the upper openings and/or spaced distances between the upper openings and pixels are different depending on a color of each pixel, light efficiency may be improved and simultaneously a WAD may be reduced.

However, the scope of the present disclosure is not limited by this effect.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims, and their equivalents.

What is claimed is:

1. An organic light-emitting display apparatus comprising:
    a plurality of organic light-emitting diodes on a substrate and including a first pixel and a second pixel respectively emitting light of different colors;
    a pixel-defining layer including a first opening and a second opening, the first opening defining an emission area of the first pixel, and the second opening defining an emission area of the second pixel;
    a total reflective layer over the pixel-defining layer, the total reflective layer including a first upper opening corresponding to the first pixel and a second upper opening corresponding to the second pixel; and
    a planarization layer covering the total reflective layer and having a refractive index greater than a refractive index of the total reflective layer,
    wherein an area of the first upper opening is different from an area of the second upper opening.

2. The organic light-emitting display apparatus of claim 1, wherein a horizontal spaced distance along a top surface of the substrate between an edge of the first opening of the pixel-defining layer and an inner edge of the first upper opening is different from a horizontal spaced distance between an edge of the second pixel and an inner edge of the second upper opening.

3. The organic light-emitting display apparatus of claim 1, wherein the first upper opening and the second upper opening have a quadrangular shape in which corners thereof are rounded.

4. The organic light-emitting display apparatus of claim 1, wherein a cross-sectional shape of the first upper opening has a tapered main inclination, and an angle θ of the tapered main inclination satisfies:

$$\theta > \sin^{-1}\left(\frac{n1}{n2}\right)$$

where n1 is a refractive index of the total reflective layer, and n2 is a refractive index of the planarization layer.

5. The organic light-emitting display apparatus of claim 1, further comprising:
    a thin-film encapsulation layer over the substrate and covering the plurality of organic light-emitting diodes, the thin-film encapsulation layer including a first inorganic encapsulation layer, an organic encapsulation layer, and a second inorganic encapsulation layer,
    wherein the total reflective layer is over the thin-film encapsulation layer.

6. The organic light-emitting display apparatus of claim 5, wherein a horizontal spaced distance 'd' along a top surface of the substrate between an edge of the first opening and an inner edge of the first upper opening satisfies Conditions 1 and 2 below:

$$0 < d \le d \text{ max} \qquad \text{Condition 1}$$

$$d\max = t2\tan\left(\sin^{-1}\left(\frac{n2}{n3}\sin(\pi - 2\theta)\right)\right) \qquad \text{Condition 2}$$

where t2 is a thickness of the organic encapsulation layer, n3 is a refractive index of the organic encapsulation layer, and n2 is a refractive index of the planarization layer.

7. The organic light-emitting display apparatus of claim 1, wherein a cross-sectional shape of the first upper opening and the second upper opening has a tapered main inclination and an inclined structure having an angle different from that of the tapered main inclination, and an angle θ of the tapered main inclination satisfies:

$$\theta > \sin^{-1}\left(\frac{n1}{n2}\right)$$

where n1 is a refractive index of the total reflective layer, and n2 is a refractive index of the planarization layer.

8. The organic light-emitting display apparatus of claim 1, further comprising:
    a thin-film encapsulation layer that is over the substrate and covers the plurality of organic light-emitting diodes, the thin-film encapsulation layer including a first inorganic encapsulation layer, an organic encapsulation layer, and a second inorganic encapsulation layer; and
    a touchscreen on the thin-film encapsulation layer,
    wherein the total reflective layer is on the touchscreen.

9. The organic light-emitting display apparatus of claim 1, further comprising:
    a third pixel configured to emit light of a color different from that of the first pixel and that of the second pixel,
    wherein the total reflective layer includes a third upper opening corresponding to the third pixel, and an area of the third upper opening is different from respective areas of the first upper opening and the second upper opening.

10. The organic light-emitting display apparatus of claim 9, wherein a horizontal spaced distance between an edge of the third pixel and an inner edge of the third upper opening is different from a horizontal spaced distance between an edge of the first pixel and an inner edge of the first upper opening.

11. An organic light-emitting display apparatus comprising:
a first organic light-emitting diode, a second organic light-emitting diode, and a third organic light-emitting diode in a display area over a substrate, the first organic light-emitting diode, the second organic light-emitting diode, and the third organic light-emitting diode respectively emitting light of different colors;
a pixel-defining layer covering edges of a pixel electrode of each of the first organic light-emitting diode, the second organic light-emitting diode, and the third organic light-emitting diode, and having a first opening, a second opening, and a third opening respectively defining respective emission areas of the first organic light-emitting diode, the second organic light-emitting diode, and the third organic light-emitting diode by respectively exposing respective central portions of the first organic light-emitting diode, the second organic light-emitting diode, and the third organic light-emitting diode;
a thin-film encapsulation layer including at least one organic encapsulation layer and at least one inorganic encapsulation layer, and covering the first organic light-emitting diode, the second organic light-emitting diode, and the third organic light-emitting diode;
a total reflective layer over the thin-film encapsulation layer and including a first upper opening, a second upper opening, and a third upper opening respectively corresponding to the first opening, the second opening, and the third opening; and
a planarization layer covering the total reflective layer,
wherein a horizontal spaced distance 'd1' along a top surface of the substrate between an edge of the first opening and an inner edge of the first upper opening is different from a horizontal spaced distance 'd2' between an edge of the second opening and an inner edge of the second upper opening.

12. The organic light-emitting display apparatus of claim 11, wherein the horizontal spaced distance 'd1' along the top surface of the substrate between an edge of the first opening and the inner edge of the first upper opening is different from a horizontal spaced distance 'd3' between an edge of the third opening and an inner edge of the third upper opening.

13. The organic light-emitting display apparatus of claim 11, wherein a refractive index of the planarization layer is greater than a refractive index of the total reflective layer.

14. The organic light-emitting display apparatus of claim 11, wherein at least one of an area of the first upper opening, an area of the second upper opening, or an area of the third upper opening is different from the others.

15. The organic light-emitting display apparatus of claim 11, wherein a cross-sectional shape of each of the first upper opening, the second upper opening, and the third upper opening has a tapered main inclination, and angles of the tapered main inclinations are the same.

16. The organic light-emitting display apparatus of claim 15, wherein angle $\theta$ of the tapered main inclinations satisfies:

$$\theta > \sin^{-1}\left(\frac{n1}{n2}\right)$$

where n1 is a refractive index of the total reflective layer, and n2 is a refractive index of the planarization layer.

17. The organic light-emitting display apparatus of claim 11, wherein the horizontal spaced distances 'd1' and 'd2' satisfy Conditions 1 and 2 below:

$$0 < d1, d2 \leq d\max \qquad \text{Condition 1}$$

$$d\max = t2\tan\left(\sin^{-1}\left(\frac{n2}{n3}\sin(\pi - 2\theta)\right)\right) \qquad \text{Condition 2}$$

where t2 is a thickness of the organic encapsulation layer, n3 is a refractive index of the organic encapsulation layer, and n2 is a refractive index of the planarization layer.

18. The organic light-emitting display apparatus of claim 11, wherein at least one of respective sizes of the first opening, the second opening, and the third opening is different from the others.

19. The organic light-emitting display apparatus of claim 11, further comprising:
a touchscreen on the thin-film encapsulation layer over the substrate, wherein the total reflective layer is on the touchscreen.

20. The organic light-emitting display apparatus of claim 11, further comprising:
a dam unit in a peripheral area around the display area over the substrate and protruding from the substrate.

* * * * *